(12) United States Patent
Zhang et al.

(10) Patent No.: US 12,461,254 B2
(45) Date of Patent: Nov. 4, 2025

(54) PHOTOELECTRIC DETECTOR AND ELECTRONIC DEVICE

(71) Applicants: Beijing BOE Sensor Technology Co., Ltd., Beijing (CN); BOE TECHNOLOGY GROUP CO., LTD., Beijing (CN)

(72) Inventors: Guan Zhang, Beijing (CN); Jinyu Li, Beijing (CN); Zhenyu Wang, Beijing (CN); Zhenwu Jiang, Beijing (CN)

(73) Assignees: Beijing BOE Sensor Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/025,200

(22) PCT Filed: Apr. 28, 2022

(86) PCT No.: PCT/CN2022/089699
§ 371 (c)(1),
(2) Date: Mar. 8, 2023

(87) PCT Pub. No.: WO2023/206185
PCT Pub. Date: Nov. 2, 2023

(65) Prior Publication Data
US 2024/0302543 A1 Sep. 12, 2024

(51) Int. Cl.
*G01T 1/20* (2006.01)
*H10F 39/00* (2025.01)
*H10F 39/18* (2025.01)

(52) U.S. Cl.
CPC ..... *G01T 1/20182* (2020.05); *H10F 39/1898* (2025.01); *H10F 39/802* (2025.01);
(Continued)

(58) Field of Classification Search
CPC ... G01T 1/20182; G01T 7/00; H10F 39/1898; H10F 39/802; H10F 39/80377;
(Continued)

(56) References Cited

U.S. PATENT DOCUMENTS

| 5,572,257 A | 11/1996 | Conrads et al. |
| 6,185,274 B1 | 2/2001 | Kinno et al. |

(Continued)

FOREIGN PATENT DOCUMENTS

| CN | 1574375 A | 2/2005 |
| CN | 1969387 A | 5/2007 |

(Continued)

OTHER PUBLICATIONS

WIPO, International Search Report of PCT/CN2023/091353 issued on Jun. 19, 2023.

*Primary Examiner* — Tony Ko
(74) *Attorney, Agent, or Firm* — HOUTTEMAN LAW LLC (57) ABSTRACT

The present disclosure provides a photoelectric detector and an electronic device. The photoelectric detector has a pixel region and a peripheral region surrounding the pixel region, includes a base substrate and a plurality of pixel units arranged on the base substrate and positioned in the pixel region; each pixel unit includes a thin film transistor, a photodiode and a storage capacitor; for each pixel unit, a first electrode of the thin film transistor is connected with a first electrode of the photodiode and a first electrode plate of the storage capacitor, a second electrode of the photodiode is connected with a first bias signal line, a second electrode plate of the storage capacitor is connected with a second bias signal line, the first bias signal line is electrically connected with the second bias signal line at a connection node located in the peripheral region.

20 Claims, 6 Drawing Sheets

(52) U.S. Cl.
CPC ... *H10F 39/80377* (2025.01); *H10F 39/8057* (2025.01); *H10F 39/811* (2025.01)

(58) Field of Classification Search
CPC .... H10F 39/8057; H10F 39/811; H10F 39/12; H10F 39/8037; H10F 55/255; H04N 5/32; H10D 86/00
See application file for complete search history.

(56) References Cited

U.S. PATENT DOCUMENTS

| | | |
|---|---|---|
| 6,784,949 B1 | 8/2004 | Nagata et al. |
| 2016/0141349 A1 | 5/2016 | Yun et al. |

FOREIGN PATENT DOCUMENTS

| | | |
|---|---|---|
| CN | 101166998 A | 4/2008 |
| CN | 102157533 A | 8/2011 |
| CN | 102306653 A | 1/2012 |
| CN | 102157533 B | 7/2013 |
| CN | 103283024 A | 9/2013 |
| CN | 103904086 A | 7/2014 |
| CN | 106169484 A | 11/2016 |
| CN | 108476294 A | 8/2018 |
| CN | 109830563 A | 5/2019 |
| CN | 110416278 A | 11/2019 |
| CN | 110854147 A | 2/2020 |
| CN | 111653581 A | 9/2020 |
| CN | 113406832 A | 9/2021 |
| CN | 114503268 A | 5/2022 |
| CN | 115117099 A | 9/2022 |
| DE | 4118154 A1 * | 12/1992 |
| EP | 0523784 A1 | 1/1993 |
| JP | 2006208753 A | 8/2006 |
| JP | 2009267343 A | 11/2009 |
| KR | 101843284 B1 | 3/2018 |

* cited by examiner

PHOTOELECTRIC DETECTOR AND ELECTRONIC DEVICE

TECHNICAL FIELD

The present disclosure relates to the technical field of flat panel detectors, and particularly relates to a photoelectric detector and an electronic device.

BACKGROUND

The X-ray detection technology is widely applied to the fields of industrial nondestructive detection, container scanning, circuit board inspection, medical treatment, security protection, industry and the like, and has a wide application prospect. The traditional X-Ray imaging technology performs analog signal imaging, and results in a relatively low resolution and a poor image quality. The X-ray Digital Radiography (DR) technology appearing in the late years of the 1990s directly converts an X-ray image into a digital image by using an X-ray photoelectric detector, and has been a hot spot of current research because the converted digital image is clear, has a relatively high resolution and is easy to be stored and transmitted. The X-ray photoelectric detectors are classified into a direct conversion type (Direct DR) and an indirect conversion type (Indirect DR) according to their structures. The X-ray photoelectric detector of the indirect conversion type has advantages of the related technology being mature, resulting in a relatively low cost, having a relatively high Detective Quantum Efficiency (DQE), having a good reliability and the like, and thus is widely developed and applied.

Generally, a Flat Panel Display (FPD) includes a scintillator, an image sensor, a control module, a signal processing module, and a communication module. The scintillator absorbs the X-ray and converts the X-ray into visible light; the image sensor is composed of a pixel array including a photodiode and a thin film transistor (TFT), and under driving of the control module, the visible light generated by the scintillator is converted into an electric signal; the signal processing module amplifies the electric signal, converts the electric signal into a digital signal through an analog-to-digital converter, and performs imaging after performing a correction compensation processing.

The PIN type X-ray photoelectric detector mainly includes a thin film transistor (TFT) and a photodiode (PIN). Under an irradiation of X-rays, a scintillator layer or a phosphor layer of an indirect conversion type X-ray photoelectric detector converts X-ray photons into visible light, then converts the visible light into an electrical signal under an action of the PIN, and finally reads the electrical signal through the TFT and outputs the electrical signal to obtain a display image.

The photoelectric detector with a metal-semiconductor-metal (MSM) structure does not need a doping process, has advantages of resulting in a simple preparation process and a relatively low cost and the like, and has a relatively high filling rate and a good response speed. The preparation process for preparing the photoelectric detector with the metal-semiconductor-metal (MSM) structure is compatible with the preparation process for preparing the thin film transistor, and the photoelectric detector with the metal-semiconductor-metal (MSM) structure is easy to be integrated, so that the ray detector adopting the photoelectric detector with the metal-semiconductor-metal (MSM) structure has the advantages of resulting in a simple preparation process and a relatively lower cost. However, the photoelectric detector with the metal-semiconductor-metal (MSM) structure has a relatively large dark current, resulting in a relatively low Detective Quantum Efficiency (DQE), and a relatively low Modulation Transfer Function (MTF).

The ray detector further includes a scintillator that absorbs rays and converts radiation energy into light to be detected by a photoelectric sensor. It should be noted that the scintillator may be sensitive to X-rays, gamma rays, or other rays as desired. In this way, the ray detector may act as a detector such as an X-ray detector, a gamma ray detector, or the like.

SUMMARY

The present disclosure is directed to at least one of the technical problems in the related art, and provides a photoelectric detector and an electronic device.

In a first aspect, the present disclosure provides a photoelectric detector having a pixel region and a peripheral region surrounding the pixel region, the photoelectric detector includes a base substrate, and a plurality of pixel units disposed on the base substrate and positioned in the pixel region; at least one of the pixel units includes a thin film transistor, a photodiode and a storage capacitor; for each pixel unit, a first electrode of the thin film transistor is connected with a first electrode of the photodiode and a first electrode plate of the storage capacitor, a second electrode of the photodiode is connected with a first bias signal line, a second electrode plate of the storage capacitor is connected with a second bias signal line, the first bias signal line is electrically connected with the second bias signal line at a connection node located in the peripheral region.

In some implementations, the plurality of pixel units form a plurality of first pixel groups arranged side by side along a first direction and form a plurality of second pixel groups arranged side by side along a second direction; the pixel units in each first pixel group are arranged side by side along the second direction; the pixel units in each second pixel group are arranged side by side along the first direction; for each second pixel group, gate electrodes of thin film transistors are connected with a same gate line; for each first pixel group, second electrodes of thin film transistors are connected with a same data line; second electrodes of photodiodes are connected with the same first bias signal line; second electrode plates of storage capacitors are connected with the same second bias signal line, and the first bias signal line is electrically connected with the second bias signal line.

In some implementations, the first bias signal line includes a first extension portion and a first connection portion; the first extension portion extends along the second direction, and the first connection portion is positioned in the peripheral region and connected with the first extension portion; the second bias signal line includes a second extension portion and a second connection portion; the second extension portion extends along the second direction, and the second connection portion is positioned in the peripheral region and connected with the second extension portion; for the first bias signal line and the second bias signal line electrically connected to the same first pixel group, the first connection portion and the second connection portion are electrically connected through a first connection via.

In some implementations, areas of orthographic projections of the first connection portion, the second connection portion and the first connection via on the base substrate are respectively a first area, a second area and a third area; a ratio of the first area to the third area and a ratio of the second area to the third area each range from 16:9 to 4:1.

In some implementations, a center of an orthographic projection of the first connection via on the base substrate coincides with centers of orthographic projections of the first connection portion and the second connection portion, electrically connected through the first connection via, on the base substrate.

In some implementations, for the first connection portion, the second connection portion and the first connection via, the centers of the orthographic projections of which on the base substrate coincides with each other, a distance between the orthographic projections of the first connection via and the first connection portion on the base substrate is a first distance; a distance between the orthographic projections of the first connection via and the second connection portion on the base substrate is a second distance; the first distance and the second distance each range from 1.5μ to 3 μm.

In some implementations, at least part of first connection portions arranged adjacent to each other are connected together through a connection strip.

In some implementations, the first connection portion and the connection strip electrically connected with the first connection portion are formed into an integral structure (e.g., one piece).

In some implementations, for the first bias signal line, the second bias signal line and the data line electrically connected to the same first pixel group, the first extension portion is located between the second extension portion and the data line.

In some implementations, a distance between the first extension portion and the second extension portion in the first direction is greater than a distance between the first extension portion and the data line in the first direction.

In some implementations, the photoelectric detector includes a first conductive layer, a first insulation layer and a second conductive layer sequentially arranged on the base substrate; the first electrode and the second electrode of the thin film transistor, the data line, the second bias signal line and the second electrode plate of the storage capacitor are located in the first conductive layer; the first electrode plate of the storage capacitor is located in the second conductive layer, is common to the first electrode of the photodiode, and is electrically connected with the first electrode of the thin film transistor through a second connection via penetrating through the first insulation layer.

In some implementations, each pixel unit further includes a first connection electrode located in the first conductive layer; the first electrode of the thin film transistor is electrically connected with the first connection electrode, and the first connection electrode is electrically connected with the first electrode plate of the storage capacitor through the second connection via.

In some implementations, a semiconductor layer and the second electrode of the photodiode are sequentially arranged on a side, away from the base substrate, of the second conductive layer; the photoelectric detector further includes a second insulation layer and a third conductive layer sequentially arranged on a side, away from the base substrate, of a layer where the second electrode of the photodiode is located; the first bias signal line is located in the third conductive layer, and the first bias signal line is electrically connected to the second electrode of the photodiode through a third connection via hole penetrating through the first insulation layer.

In some implementations, each pixel unit further includes a light blocking pattern, and the light blocking pattern is located in the third conductive layer; an orthographic projection of the light blocking pattern of the pixel unit on the base substrate covers an area where the thin film transistor is located.

In some implementations, the second insulation layer includes a first inorganic insulation layer, an organic insulation layer and a second inorganic insulation layer sequentially arranged along a direction away from the base substrate.

In a second aspect, the present disclosure provides an electronic device, including the photoelectric detector described above.

DETAILED DESCRIPTION

In order to make technical solutions of the present disclosure better understood, the present disclosure is further described in detail below with reference to the accompanying drawings and implementations.

Unless defined otherwise, technical or scientific terms used herein shall have the ordinary meaning as understood by one of ordinary skill in the art to which this disclosure belongs. The use of "first," "second," and the like in this disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprising/including" or "comprises/includes", and the like, means that the element or item preceding the word contains the element or item listed after the word and its equivalent, but does not exclude other elements or items.

The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when an absolute position of an object being described is changed, the relative positional relationships may be changed accordingly.

Figure 1:
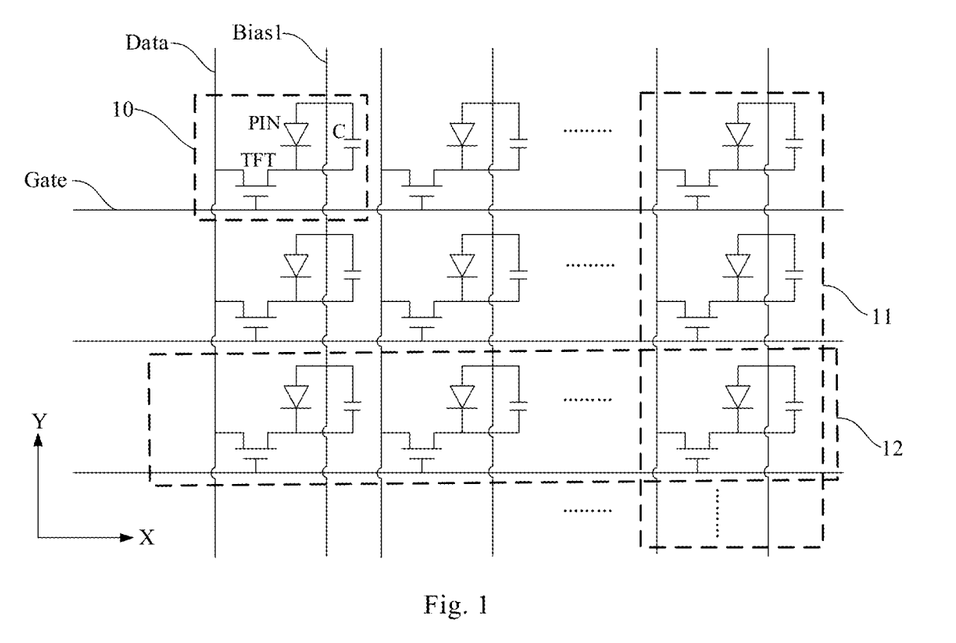
FIG. 1 is a schematic diagram of an exemplary photoelectric detector.

FIG. 1 is a schematic diagram of an exemplary photoelectric detector; as shown in FIG. 1, the photoelectric detector includes a base substrate, and a plurality of pixel units 10, a plurality of gate lines Gate, a plurality of data lines Data, and a plurality of first bias signal lines Bias1 disposed on the base substrate. The plurality of pixel units 10 form a plurality of first pixel groups 11 arranged side by side in a first direction X, and form a plurality of second pixel groups 12 arranged side by side in a second direction Y; the pixel units 10 in each first pixel group 11 are arranged side by side along the second direction Y, and the pixel units 10 in each second pixel group 12 are arranged side by side along the first direction X. Each pixel unit 10 includes a thin film transistor TFT, a photodiode PIN, and a storage capacitor C. For each pixel unit 10, a first electrode of the thin film transistor TFT is electrically connected with a first electrode of the photodiode PIN and a first electrode plate CC1 of the storage capacitor C; a second electrode plate CC2 of the storage capacitor C is electrically connected to a second electrode of the photodiode PIN. Second electrodes of thin film transistors TFT in a same first pixel group 11 are connected to a same data line Data, and second electrodes of photodiodes PIN in a same first pixel group 11 are connected to a same first bias signal line Bias1. Gate electrodes of thin film transistors TFT in a same second pixel group 12 are connected to a same gate line Gate.

For clear understanding of operation principles of the photoelectric detector, an operation of one pixel unit 10 will be described below. The photodiode PIN in the pixel unit 10 is configured to convert a received optical signal into an electrical signal, in response to that an operating level signal is written into the gate line Gate, the thin film transistor TFT is turned on, and the data line Data reads the electrical signal generated by the photodiode PIN through the thin film transistor TFT and output the electrical signal to an image processing module, so that the image processing module generates an image according to the read electrical signal to be displayed by a display device. It should be noted that a reason why each pixel unit 10 is provided with the storage capacitor C is that, as a requirement for an image resolution is continuously increased, a number of pixel units 10 in the photoelectric detector is gradually increased, which leads to an effective area of the photodiode PIN being gradually reduced, that is, a storage capacity of a capacitor of the photodiode PIN is reduced, and in such case, by connecting the storage capacitor in parallel to the photodiode PIN, an amount of stored charges can be increased, so as to increase a dynamic range of the photodiode PIN.

It is found that providing the storage capacitor C in the pixel unit 10 increases a size of the pixel unit 10, which limits a realization of displaying an image with a relatively high resolution, and therefore how to increase the amount of charges stored by the storage capacitor C without increasing the size of the pixel unit 10 becomes a technical problem to be solved urgently.

In view of at least the technical problem mentioned above, following technical solutions are provided in the present disclosure.

Figure 2:
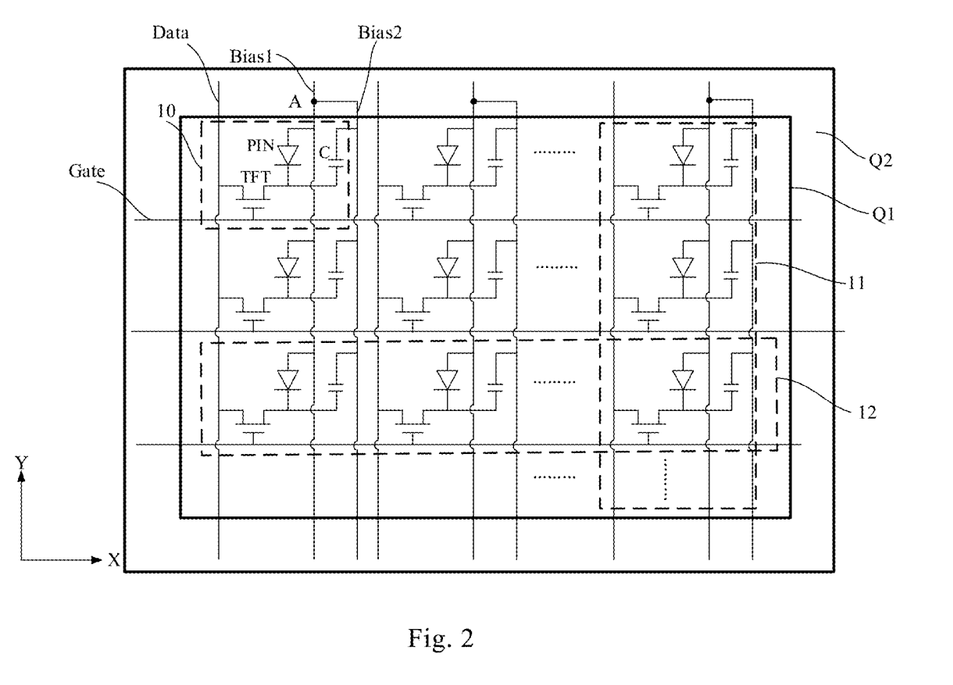
FIG. 2 is a schematic diagram of a photoelectric detector according to the present disclosure.
Figure 3:
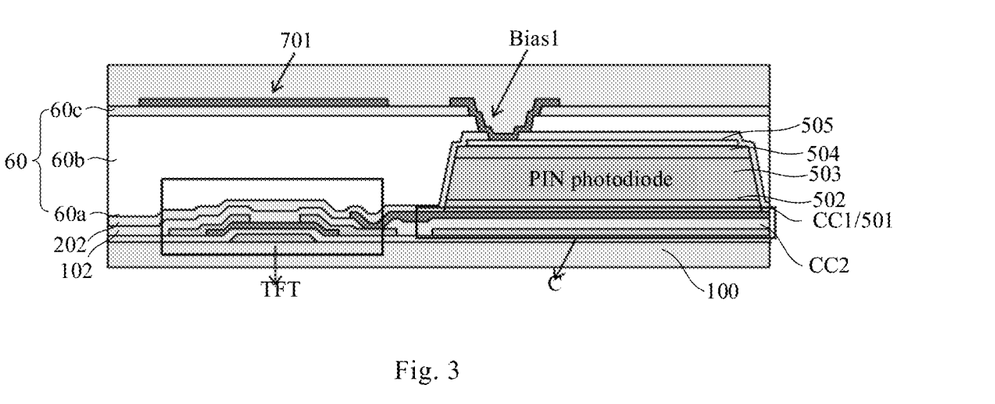
FIG. 3 is a partial cross-sectional view of a pixel unit of a photoelectric detector according to the present disclosure.
Figure 4:
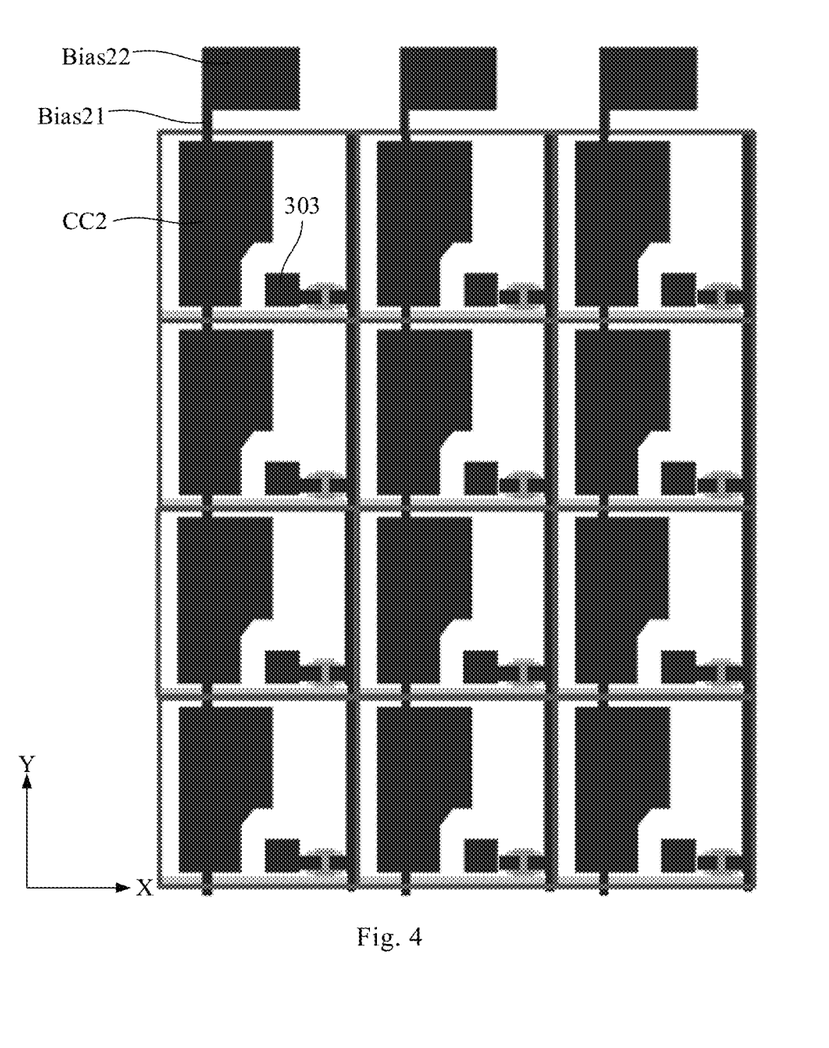
FIG. 4 is a top view of a layer, in which a second bias signal line and a second electrode plate of a storage capacitor are formed, in a photoelectric detector according to the present disclosure.
Figure 5:
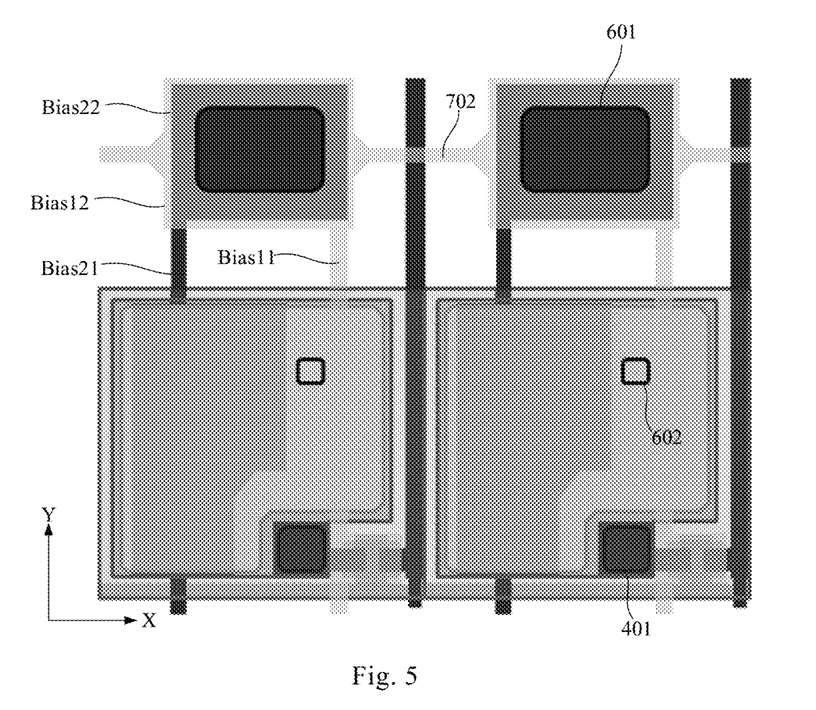
FIG. 5 is a top view of a first bias signal line formed in a photoelectric detector according to the present disclosure.

In a first aspect, FIG. 2 is a schematic diagram of a photoelectric detector according to the present disclosure; FIG. 3 is a partial cross-sectional view of a pixel unit of a photoelectric detector according to the present disclosure; FIG. 4 is a top view of a layer, in which a second bias signal line and a second electrode plate of a storage capacitor are formed, in a photoelectric detector according to the present disclosure; FIG. 5 is a top view of a first bias signal line formed in a photoelectric detector according to the present disclosure; as shown in FIGS. 2 to 5, the present disclosure provides a photoelectric detector having a pixel region Q1 and a peripheral region surrounding the pixel region Q1. The photoelectric detector includes a base substrate 100, and a plurality of pixel units 10, a plurality of gate lines Gate, a plurality of data lines Data, a plurality of first bias signal lines Bias1 and a plurality of second bias signal lines Bias2 disposed on the base substrate 100. Each pixel units 10 includes a thin film transistor TFT, a photodiode PIN and a storage capacitor C. For each pixel unit 10, a first electrode of the thin film transistor TFT is connected to a first electrode 501 of the photodiode PIN and a first electrode plate CC1 of the storage capacitor C; a second electrode of the thin film transistor TFT is connected with the data line Data, and a gate electrode of the thin film transistor TFT is connected with the gate line Gate; a second electrode 505 of the photodiode PIN is connected to the first bias signal line Bias1, a second electrode plate CC2 of the storage capacitor C is connected to the second bias signal line Bias2, the first bias signal line is electrically connected to the second bias signal line at a connection node A located in the peripheral region Q2. Thus, the photoelectric detector according to the present disclosure can reduce openings in the pixel region Q1, so that the second electrode 505 of the photodiode PIN is electrically connected to the second electrode plate CC2 of the storage capacitor C, which is helpful for increasing a size of the storage capacitor C in the pixel unit 10, thereby increasing the amount of charges stored in the photodiode PIN, and further increasing the dynamic range of the photodiode PIN.

In some examples, the plurality of pixel units 10 are each disposed in the pixel region Q1, and the plurality of pixel units 10 form a plurality of first pixel groups 11 disposed side by side along a first direction X, and a plurality of second pixel groups 12 disposed side by side along a second direction Y. The pixel units 10 in each first pixel group 11 are arranged side by side along the second direction Y, and the pixel units 10 in each second pixel group 12 are arranged side by side along the first direction X. For each second pixel group 12, gate electrodes 101 of thin film transistors TFT are connected to the same gate line Gate. For each first pixel group 11, second electrodes of thin film transistors TFT are connected to the same data line Data; second electrodes 505 of photodiodes PIN are connected to the same first bias signal line Bias1; second electrode plates CC2 of storage capacitors C are connected with the same second bias signal line Bias2; the first bias signal line Bias1 is electrically connected to the second bias signal line Bias2 at the connection node A located in the peripheral region.

In the present disclosure, for each first pixel group 11, the second electrodes 505 of the photodiodes PIN are connected to the same first bias signal line Bias1; the second electrode plates CC2 of the storage capacitors C are connected to the same second bias signal line Bias2, and the first bias signal line Bias1 and the second bias signal line Bias2 are electrically connected in the peripheral region, that is, bias voltages loaded to the second electrode 505 of the photodiode PIN and the second electrode plate CC2 of the storage capacitor C are the same. As can be seen from the photoelectric detector shown in FIG. 1, the same bias voltage being applied to the second electrode 505 of the photodiode PIN and the second electrode plate CC2 of the storage capacitor C is realized by directly electrically connecting the second electrode 505 of the photodiode PIN with the second electrode plate CC2 of the storage capacitor C, but usually the second electrode 505 of the photodiode PIN and the second electrode plate CC2 of the storage capacitor C are not located in a same layer, and in such case, a via is desired to be formed in the pixel region Q1 to electrically connect the second electrode 505 of the photodiode PIN with the second electrode plate CC2 of the storage capacitor C. In the present disclosure, the second bias line may be directly electrically connected to the second electrode plate CC2 of the storage capacitor C, that is, they may be disposed in a same layer, and in such case, a via is desired to be formed only in the peripheral region to electrically connect the first bias signal line Bias1 with the second bias signal line Bias2, so that the second electrode 505 of the photodiode PIN and the second electrode plate CC2 of the storage capacitor C are loaded with the same bias voltage. Thus, the photoelectric detector according to the present disclosure can reduce a number of vias to be formed in the pixel region Q1, which is helpful for increasing the size of the storage capacitor C in the pixel unit 10, thereby increasing the amount of charges stored in the photodiode PIN, and further increasing the dynamic range of the photodiode PIN.

It should be noted that, since layers where the first bias signal line Bias1 and the second bias signal line Bias2 are located are both conductive layers, and in order to avoid a short circuit between such two layers, an interlayer insulation layer is disposed between the two layers, and therefore, the above-mentioned via is to be formed in the interlayer insulation layer by etching.

In some implementations, the first bias signal line Bias1 includes a first extension portion Bias11 and a first connection portion Bias12; the second bias signal line Bias2 includes a second extension portion Bias21 and a second connection portion Bias22. The first extension portion Bias11 and the second extension portion Bias21 each extend along the second direction Y, the first connection portion Bias12 and the second connection portion Bias22 are both located in the peripheral region, the first connection portion Bias12 is electrically connected to the first extension portion Bias11, and the second connection portion Bias22 is electrically connected to the second extension portion Bias21. For the first bias signal line Bias1 and the second bias signal line Bias2 electrically connected to the same first pixel group 11, the first connection portion Bias12 and the second connection portion Bias22 are electrically connected through a first connection via 601. It should be noted that the first bias signal line Bias1 and the second bias signal line Bias2 electrically connected to the same first pixel group 11 respectively refer to, for each first pixel group 11, the first bias signal line Bias1 connected to the second electrodes 505 of the photodiodes PIN in the first pixel group 11 and the second bias signal line Bias2 connected to the second electrode plates CC2 of the storage capacitors C in the first pixel group 11. In the present disclosure, the first bias signal line Bias1 and the second bias signal line Bias2 are electrically connected through an electrical connection between the first connection portion Bias12 and the second connection portion Bias22, so that a stability of connection is ensured, and the yield of products is improved. In addition, the first bias signal line Bias1 and the second bias signal line Bias2 are located in different layers, an interlayer insulation layer is disposed between such layers, and the first connection via 601 refers to a via penetrating through the interlayer insulation layer.

Further, areas of orthographic projections of the first connection portion Bias12 and the second connection portion Bias22 electrically connected through the first connection via 601, and an orthographic projection of the first connection via 601 on the base substrate 100 are a first area, a second area, and a third area, respectively. A ratio of the first area to the third area and a ratio of the second area to the third area each range from 16:9 to 4:1. In such case, electrically connecting the first connection portion Bias12 with the second connection portion Bias22 can completely cover the first connection via 601 therebetween, thereby ensuring a reliable connection between the first connection portion Bias12 and the second connection portion Bias22.

Further, centers of the orthographic projections of the first connection portion Bias12 and the second connection portion Bias22, electrically connected through the first connection via 601, and the first connection via 601 on the base substrate 100 coincide with each other. For the first connection portion Bias12, the second connection portion Bias22 and the first connection via 601, the centers of the orthographic projections of which on the base substrate 100 coincide with each other, a distance between the orthographic projections of the first connection via 601 and the first connection portion Bias12 on the base substrate 100 is a first distance, a distance between the orthographic projections of the first connection via 601 and the second connection portion Bias22 on the base substrate 100 is a second distance, and the first distance and the second distance each range from 1.5 µm to 3 µm. The first distance and the second distance may be equal, substantially equal, or unequal to each other. In such arrangement, the first connection via 601 between the first connection portion Bias12 and the second connection portion Bias22 can be completely covered by electrically connecting the first connection portion Bias12 and the second connection portion Bias22, so that a reliable connection between the first connection portion Bias12 and the second connection portion Bias22 is ensured.

In some examples, in a case where each first bias signal line Bias1 includes a first extension portion Bias11 and a first connection portion Bias12, at least part of first connection portions Bias12 arranged adjacent to each other are connected together by a connection strip 702. For example, any two first connection portions Bias12 adjacent to each other are connected together through a short strip. In such way, a number of pins of a driving chip for providing bias signals to the first bias signal lines Bias1 can be effectively reduced, thereby resulting in a reduced cost.

Further, in the present disclosure, the first connection portion Bias12 of the first bias signal line Bias1 and the connection strip 702 connected thereto are formed into an integral structure (e.g., one piece). In such case, the first Bias signal line Bias1 and the connection strip 702 can be prepared by a single process, and in response to that the first connection portion Bias12 of the first bias signal line Bias1 and the connection strip 702 connected thereto are formed into an integral structure (i.e., one piece), the stability of connection therebetween is ensured.

In some examples, with continued reference to FIG. 2, for the first bias signal line Bias1, the second bias signal line Bias2, and the data line Data electrically connected to the same first pixel group 11, the first extension portion Bias11 of the first bias signal line Bias1 is located between the second extension portion Bias21 of the second bias signal line Bias2 and the data line Data. with such arrangement, the same first pixel group 11, it is convenient for electrically connecting the second electrodes of the thin film transistors TFT with the data line Data, electrically connecting the second electrodes 505 of the photodiodes PIN with the first bias signal line Bias1, and electrically connecting the second electrode plates CC2 of the storage capacitors C with the second bias signal line Bias2, so that wiring is convenient, and wiring uniformity in the pixel region Q1 is ensured.

Further, for the first bias signal line Bias1, the second bias signal line Bias2, and the data line Data electrically connected to the same first pixel group 11, if the first extension portion Bias11 of the first bias signal line Bias1 is located between the second extension portion Bias21 of the second bias signal line Bias2 and the data line Data, a distance between the first extension portion Bias11 and the second extension portion Bias21 in the first direction X is greater than a distance between the first extension portion Bias11 and the data line Data in the first direction X. With continued reference to FIG. 2, such arrangement is provided because the thin film transistor TFT and the photodiode PIN are located between the data line Data and the first extension portion Bias11 of the first bias signal line Bias1, and only the storage capacitor C is provided between the first extension portion Bias11 of the first bias signal line Bias1 and the second extension portion Bias21 of the second bias signal line Bias2, a larger layout space is desired to be reserved for the thin film transistor TFT and the photodiode PIN.

Specific film structures of the photoelectric detector in the present disclosure will be described below. Before the description, it should be noted that, in the following description, only a case where the thin film transistor TFT used by the photoelectric detector is of a bottom gate type, and the first electrode and the second electrode of the thin film transistor TFT are a source electrode 301 and a drain electrode 302, respectively, is taken as an example for illustration, which, however, does not constitute a limitation to the protective scope of the present disclosure, as understood by ordinary skills in the art.

In an example, the photoelectric detector in the present disclosure includes a gate metal layer, a gate insulation layer, an active semiconductor layer, a first conductive layer, a first insulation layer, a second conductive layer, a P-type semiconductor layer, an intrinsic semiconductor layer, an N-type semiconductor layer, a second electrode layer, a second insulation layer, and a third conductive layer, which are sequentially disposed in a direction away from the base substrate 100.

Figure 6:
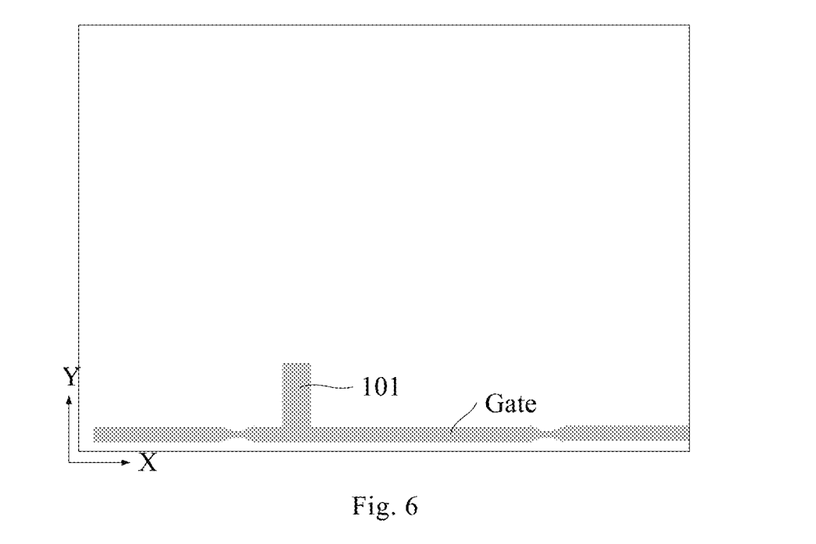
FIG. 6 is a top view of a gate metal layer formed in a photoelectric detector according to the present disclosure.

FIG. 6 is a top view of a gate metal layer formed in a photoelectric detector according to the present disclosure; as shown in FIG. 6, the gate metal layer includes a gate electrode 101 of each thin film transistor TFT and the gate lines Gate, and the gate electrode 101 of the thin film transistor TFT and the gate line Gate connected thereto are formed into an integral structure (i.e., one piece). The gate insulation layer is formed on a side of the gate metal layer away from the base substrate 100.

Figure 7:
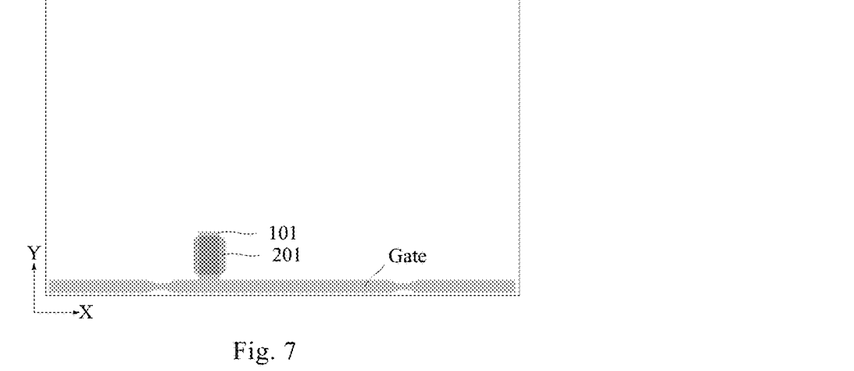
FIG. 7 is a top view of an active semiconductor layer formed in a photoelectric detector according to the present disclosure.

FIG. 7 is a top view of an active semiconductor layer formed in a photoelectric detector according to the present disclosure; as shown in FIG. 7, the active semiconductor layer includes an active layer 201 of each thin film transistor TFT. For example, the active semiconductor layer may be made of amorphous silicon, polycrystalline silicon, an oxide semiconductor material, or the like. It should be noted that a source region and a drain region of the active layer 201 may be doped with N-type impurities or P-type impurities.

The semiconductor layer of the active layer 201 may be covered by an insulation layer or may not be covered by an insulation layer.

Figure 8:
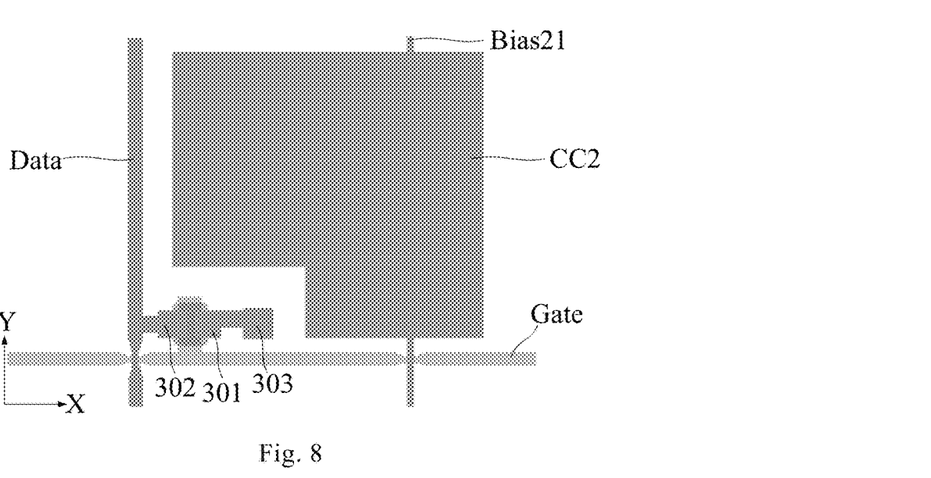
FIG. 8 is a top view of a first conductive layer formed in a photoelectric detector according to the present disclosure.

FIG. 8 is a top view of a first conductive layer formed in a photoelectric detector according to the present disclosure; as shown in FIG. 8, the first conductive layer includes the source electrode 301 and the drain electrode 302 of the thin film transistor TFT, the second electrode plate CC2 of the storage capacitor C, the second bias signal line Bias2, and the data line Data. The source electrode 301 and the drain electrode 302 of the thin film transistor TFT are electrically connected to the source region and the drain region of the active layer 201, respectively. The second electrode plate CC2 of the storage capacitor C is electrically connected to the second bias signal line Bias2. The data line Data is electrically connected to the drain electrode 302 of the thin film transistor TFT. The first insulation layer covers the first conductive layer on a side thereof away from the base substrate 100, and a second connection via 401 in each pixel unit 10 is formed in the first insulation layer, so that the first electrode of the photodiode PIN subsequently formed is electrically connected with the source electrode 301 of the thin film transistor TFT.

In some examples, the second bias signal line Bias2, which is electrically connected to the second electrode plates CC2 of the storage capacitors C in the same first pixel group 11, and the second electrode plates CC2 of the capacitors electrically connected thereto are formed into an integral structure (e.g., one piece). For example, the second bias signal line Bias2 includes a second extension portion Bias21 extending along the second direction Y and a second connection portion Bias22 electrically connected to the second extension portion Bias21, the second connection portion Bias22 is located in the peripheral region, the second extension portion Bias21 passes through the peripheral region and the pixel region Q1, and the second extension portion Bias21 passes through the second electrode plate CC2 of each storage capacitor C in the first pixel group 11 and is electrically connected to the second electrode plate CC2 of each storage capacitor C.

In some examples, the data line Data electrically connected to the drain electrodes 302 of the thin film transistors TFT in the same first pixel group 11, and the drain electrodes 302 of the thin film transistors TFT electrically connected thereto are formed into an integral structure (e.g., one piece), and the data line Data extends in the second direction Y.

In some examples, with continued reference to FIG. 8, a first connection electrode 303 in each pixel unit 10 may be further included in the first conductive layer, and the first connection electrode 303 is electrically connected to the source electrode 301 of the thin film transistor TFT. The first connection electrode 303 is further electrically connected to the second electrode plate CC2 of the storage capacitor C and the first electrode 501 of the photodiode PIN subsequently formed in the pixel unit 10.

Figure 9:
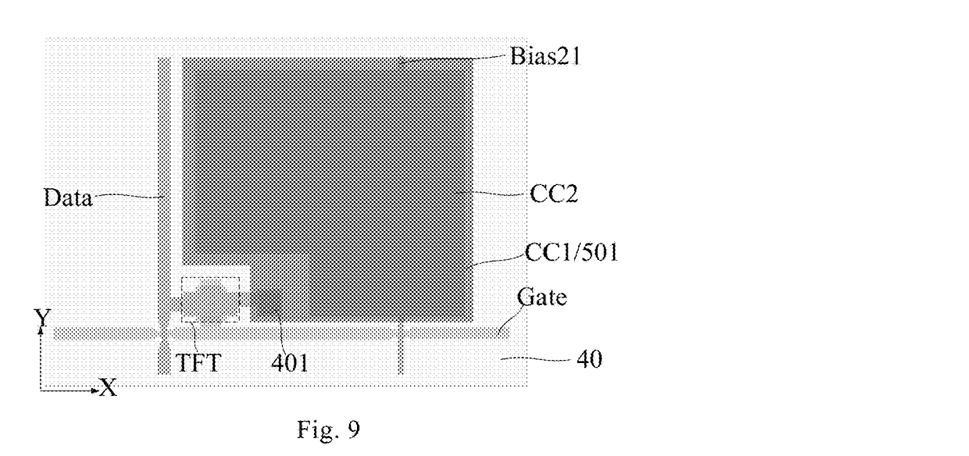
FIG. 9 is a top view of a second conductive layer formed in a photoelectric detector according to the present disclosure.

FIG. 9 is a top view of a second conductive layer formed in a photoelectric detector according to the present disclosure; as shown in FIG. 9, the second conductive layer includes the first electrode 501 of the photodiode PIN and the second electrode plate CC2 of the storage capacitor C. In each pixel unit 10, the first electrode 501 of the photodiode PIN and the second electrode plate CC2 of the storage capacitor C may be formed into an integral structure (e.g., one piece), and are connected to the source electrode 301 of the thin film transistor TFT through the second connection via 401.

Figure 10:
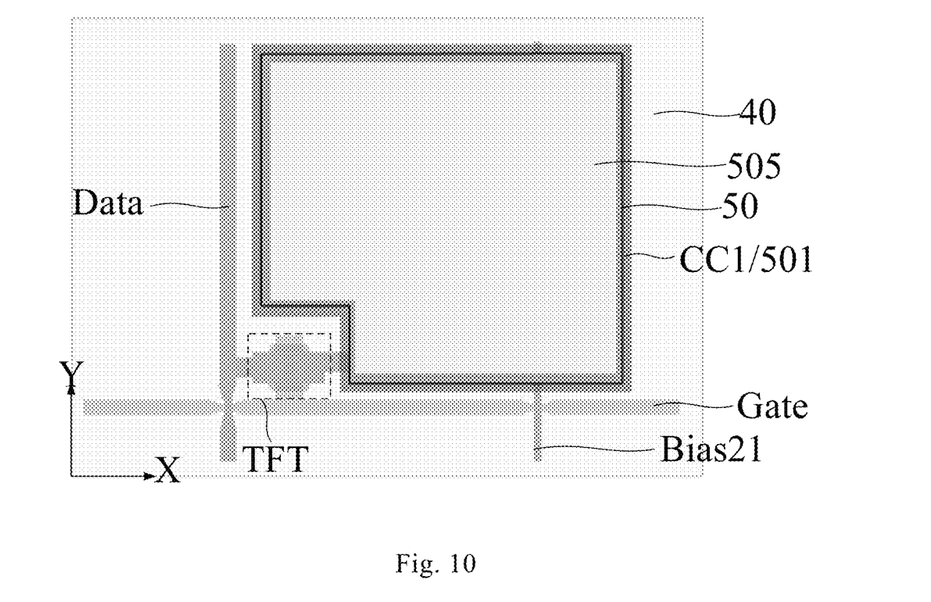
FIG. 10 is a top view of a second electrode layer formed in a photoelectric detector according to the present disclosure.

FIG. 10 is a top view of a second electrode layer formed in a photoelectric detector according to an embodiment of the present disclosure; as shown in FIG. 10, the P-type semiconductor layer, the intrinsic semiconductor layer, the N-type semiconductor layer, and the second electrode layer are sequentially disposed on a side of the second conductive layer away from the base substrate 100. The P-type semiconductor layer includes a P-type semiconductor pattern 502 of each photodiode PIN, the intrinsic semiconductor layer includes an intrinsic semiconductor pattern 503 of each photodiode PIN, the N-type semiconductor layer includes an N-type semiconductor pattern 503 of each photodiode PIN, and the second electrode layer includes the second electrode 505 of each photodiode PIN. In each pixel unit 10, the first electrode 501, the P-type semiconductor pattern 502, the intrinsic semiconductor pattern 503, an N-type semiconductor pattern 504, and the second electrode 505 are stacked to form the photodiode PIN.

The second electrode 505 is covered by the second insulation layer on a side thereof away from the base substrate 100. The second insulation layer includes a first inorganic insulation layer, an organic insulation layer, and a second inorganic insulation layer that are sequentially disposed in a direction away from the base substrate 100. The first inorganic insulation layer and the second inorganic insulation layer may be passivation layers, the organic insulation layer may be a planarization layer, and a thickness of the planarization layer is greater than that of each passivation layer.

Each pixel unit 10 further includes the first connection via 601 and a third connection via 602, the first connection via 601 is located in the peripheral region, and the third connection via 602 is located in the pixel region Q1. The first connection via 601 is configured for electrically connecting the first bias signal line Bias1 and the second bias signal line Bias2 subsequently formed. The third connection via 602 electrically connects the first bias signal line Bias1 with the second electrode 505 of the photodiode PIN.

Figure 11:
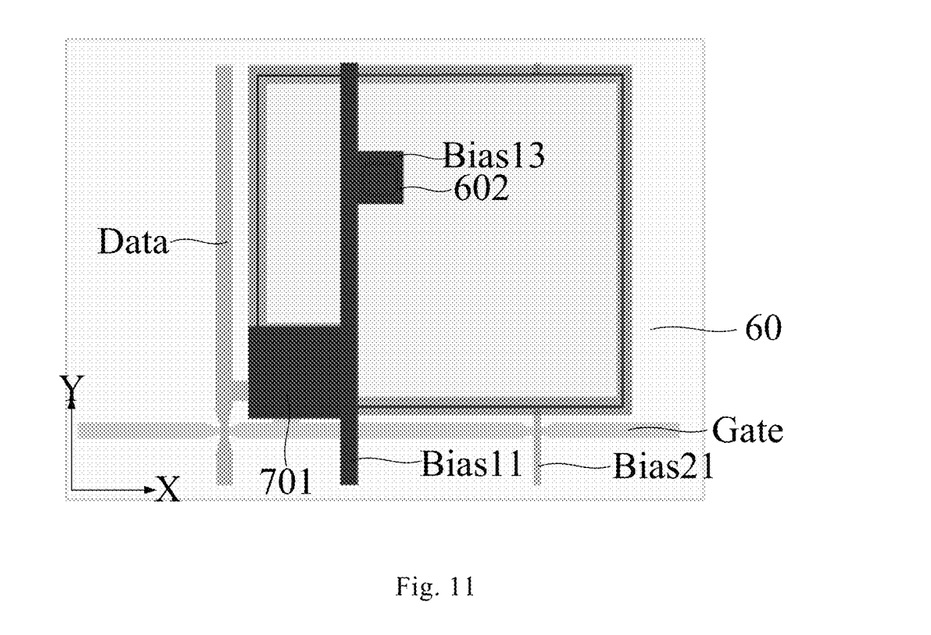
FIG. 11 is a top view of a third conductive layer formed in a photoelectric detector according to the present disclosure.

FIG. 11 is a top view of a third conductive layer formed in a photoelectric detector according to the present disclosure; as shown in FIG. 11, the third conductive layer includes the first bias signal line Bias1. The first bias signal line Bias1 is electrically connected to the second bias signal line Bias2 through the first connection via 601, and is electrically connected to the second electrode 505 of the photodiode PIN through the third connection via 602.

In some examples, for each first pixel group 11, the second electrodes 505 of the photodiodes PIN in the pixel units 10 are connected to the same second bias signal line Bias2.

In some examples, in a case where the second bias signal line Bias2 includes the second extension portion Bias21 and the second connection portion Bias22, the first bias signal line Bias1 may include a first extension portion Bias11 extending along the second direction Y and a first connection portion Bias12 electrically connected to the first extension portion Bias11, and for the first bias signal line Bias1 and the second bias signal line Bias2 electrically connected to the same first pixel group 11, the first connection portion Bias12 of the first bias signal line Bias1 is electrically connected to the second connection portion Bias22 of the second bias signal line Bias2 through the first connection via 601. The first extension portion Bias11 of the first bias signal line Bias1 is electrically connected to the second electrode 505 of the photodiode PIN through the third connection via 602.

Further, the first bias signal line Bias1 may further include a plurality of third connection portions Bias13 electrically connected to the first extension portion Bias11, the third connection portions Bias13 are disposed in one-to-one correspondence with the pixel units 10, and each third connection portion Bias13 is electrically connected to the second electrode 505 of the photodiode PIN through the third connection via 602.

Further, the third conductive layer may further include a connection strip 702 electrically connecting the first connection portions Bias12, disposed adjacent to each other, together. The connection strip 702 may extend in the first direction X.

In some examples, the third conductive layer may further include a light blocking pattern 701 therein. An orthographic projection of the light blocking pattern 701 in the pixel unit 10 on the base substrate 100 covers an area where the thin film transistor TFT is located, so that the light can be effectively prevented from irradiating the thin film transistor TFT to affect optical characteristics of the thin film transistor TFT and further cause a defect of the photoelectric detector.

Further, the light blocking pattern 701 and the first bias signal line Bias1 may be formed into an integral structure (e.g., one piece).

Figure 12:
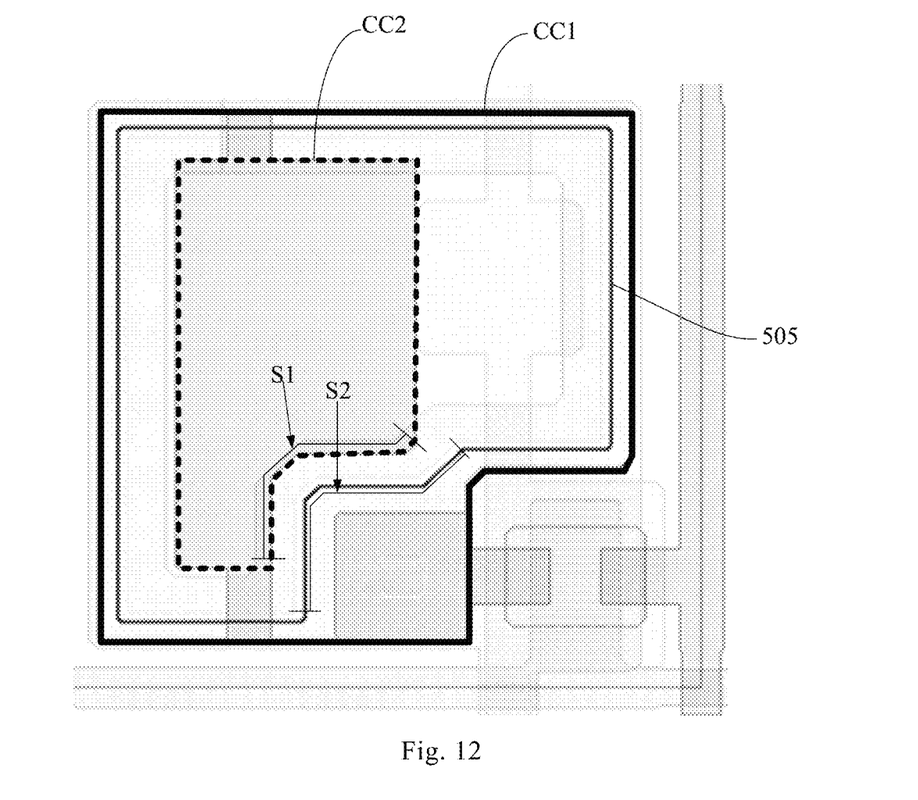
FIG. 12 is a layout of a pixel unit in a photoelectric detector according to the present disclosure.

In some examples, FIG. 12 is a layout of a pixel unit in a photoelectric detector according to the present disclosure; as shown in FIG. 12, the orthographic projection of the second electrode plate CC2 of the storage capacitor C on the base substrate 100 is located within the orthographic projection of the first electrode plate CC1 of the storage capacitor C on the base substrate 100.

In some examples, with continued reference to FIG. 12, an outline of the orthographic projection of the second electrode plate CC2 of the storage capacitor C on the base substrate 100 includes a first line segment S1, an outline of the orthographic projection of the second electrode 505 of the photodiode PIN on the base substrate 100 includes a second line segment S2, and the first line segment S1 and the second line segment S2 are parallel to each other, that is, an extending direction in which the first line segment S1 extends is the same as an extending direction in which the second line segment S2 extends, and the first line segment S1 and the second line segment S2 are bent at a same angle.

Certainly, the photoelectric detector in the present disclosure may further include a third insulation layer and a scintillation layer, which are sequentially disposed on a side of the third conductive layer away from the base substrate 100. The scintillation layer absorbs rays and converts radiation energy into light that can be detected by the photoelectric sensor. It should be noted that the scintillation layer may be sensitive to X-rays, gamma-rays or other rays as desired. In such way, the ray detector may act as a detector such as an X-ray detector, a gamma ray detector, or the like.

Figure 13:
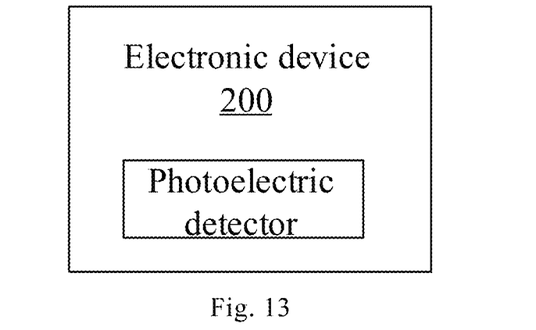
FIG. 13 is a schematic block diagram of an electronic device according to the present disclosure.

In a second aspect, FIG. 13 is a schematic block diagram of an electronic device according to the present disclosure; as shown in FIG. 13, the electronic device 200 includes the photoelectric detector described above. Examples of the electronic device 200 include devices such as medical diagnostic devices, industrial detection devices, geological exploration devices, and the like. The electronic device 200 has the same advantages as the ray detector described above.

It will be understood that the above implementations are merely exemplary implementations adopted to illustrate the principles of the present disclosure, and the present disclosure is not limited thereto. It will be apparent to those skilled in the art that various modifications and improvements may be made without departing from the spirit and scope of the present disclosure, and such modifications and improvements are considered to be within the scope of the present disclosure.

The invention claimed is:

1. A photoelectric detector having a pixel region and a peripheral region surrounding the pixel region, the photoelectric detector comprising:
   a base substrate;
   plurality of pixel units arranged on the base substrate and positioned in the pixel region, at least one of the pixel units comprising a thin film transistor having a first electrode and a second electrode, a photodiode having a first electrode and a second electrode, and a storage capacitor having a first electrode plate and a second electrode plate,
   wherein for each pixel unit, the first electrode of the thin film transistor is connected with the first electrode of the photodiode and the first electrode plate of the storage capacitor, the second electrode of the photodiode is connected with a first bias signal line, the second electrode plate of the storage capacitor is connected with a second bias signal line, and the first bias signal line is electrically connected with the second bias signal line at a connection node located in the peripheral region,
   wherein an orthographic projection of the second electrode plate of the storage capacitor on the base substrate is located within an orthographic projection of the first electrode plate of the storage capacitor on the base substrate.

2. The photoelectric detector of claim 1, wherein the plurality of pixel units form a plurality of first pixel groups arranged side by side along a first direction and form a plurality of second pixel groups arranged side by side along a second direction; the pixel units in the first pixel group are arranged side by side along the second direction; the pixel units in the second pixel group are arranged side by side along the first direction;
   for each second pixel group, gate electrodes of thin film transistors are connected with a same gate line;
   for each first pixel group, second electrodes of thin film transistors are connected with a same data line; second electrodes of photodiodes are connected with the same first bias signal line; second electrode plates of storage capacitors are connected with the same second bias signal line, and the first bias signal line is electrically connected with the second bias signal line.

3. The photoelectric detector of claim 1, wherein the first bias signal line includes a first extension portion and a first connection portion; the first extension portion extends along a second direction, and the first connection portion is positioned in the peripheral region and connected with the first extension portion; the second bias signal line includes a second extension portion and a second connection portion; the second extension portion extends along the second direction, and the second connection portion is positioned in the peripheral region and connected with the second extension portion;
   for the first bias signal line and the second bias signal line electrically connected to the same first pixel group, the first connection portion and the second connection portion are electrically connected through a first connection via.

4. The photoelectric detector of claim 3, wherein areas of orthographic projections of the first connection portion, the second connection portion, and the first connection via on the base substrate are a first area, a second area, and a third area, respectively; a ratio of the first area to the third area and a ratio of the second area to the third area each range from 16:9 to 4:1.

5. The photoelectric detector of claim 3, wherein a center of an orthographic projection of the first connection via on the base substrate coincides with centers of orthographic projections of the first connection portion and the second connection portion, electrically connected through the first connection via, on the base substrate,
   wherein for the first connection portion, the second connection portion, and the first connection via, the centers of the orthographic projections of which on the base substrate coincide with each other, a distance between the orthographic projections of the first connection portion and the first connection via on the base substrate is a first distance; a distance between the orthographic projections of the first connection via and the second connection portion on the base substrate is a second distance; the first distance and the second distance each range from 1.5 μm to 3 μm.

6. The photoelectric detector of claim 3, wherein at least part of the first connection portions disposed adjacent to each other are connected together by a connection strip.

7. The photoelectric detector of claim 6, wherein the first connection portion and the connection strip electrically connected thereto are formed into an integral structure.

8. The photoelectric detector of claim 3, wherein for the first bias signal line, the second bias signal line, and the data line electrically connected to the same first pixel group, the first extension portion is located between the second extension portion and the data line.

9. The photoelectric detector of claim 8, wherein a distance between the first extension portion and the second extension portion in the first direction is greater than a distance between the first extension portion and the data line in the first direction.

10. The photoelectric detector of claim 1, wherein the photoelectric detector comprises a first conductive layer, a first insulation layer, and a second conductive layer disposed sequentially on the base substrate;
    the first electrode and the second electrode of the thin film transistor, the data line, the second bias signal line and the second electrode plate of the storage capacitor are positioned in the first conductive layer;
    the first electrode plate of the storage capacitor is located in the second conductive layer, is common to the first electrode of the photodiode, and is electrically connected with the first electrode of the thin film transistor through a second connection via penetrating through the first insulation layer.

11. The photoelectric detector of claim 10, wherein each pixel unit further comprises a first connection electrode located in the first conductive layer; the first electrode of the thin film transistor is electrically connected with the first connection electrode, and the first connection electrode is electrically connected with the first electrode plate of the storage capacitor through the second connection via.

12. The photoelectric detector of claim 10, wherein a semiconductor layer and the second electrode of the photodiode are disposed in sequence on a side of the second conductive layer away from the base substrate; the photoelectric detector further comprises a second insulation layer and a third conductive layer which are sequentially arranged on a side, away from the substrate, of a layer where the second electrode of the photodiode is located;
    the first bias signal line is located in the third conductive layer, and the first bias signal line is electrically connected to the second electrode of the photodiode through a third connection via penetrating through the first insulation layer.

13. The photoelectric detector of claim 12, wherein each pixel unit further comprises a light blocking pattern located in the third conductive layer;
an orthographic projection of the light blocking pattern of the pixel unit on the base substrate covers an area where the thin film transistor is located.

14. The photoelectric detector of claim 12, wherein the second insulation layer comprises a first inorganic insulation layer, an organic insulation layer, and a second inorganic insulation layer disposed in sequence in a direction away from the base substrate.

15. An electronic device, comprising the photoelectric detector of claim 1.

16. The photoelectric detector of claim 1, wherein an outline of an orthographic projection of the second electrode plate of the storage capacitor on the base substrate includes a first line segment, an outline of an orthographic projection of the second electrode of the photodiode on the base substrate includes a second line segment, and the first line segment and the second line segment are parallel to each other.

17. The photoelectric detector of claim 1, wherein orthographic projections of the first bias signal line and the second bias signal line on the base substrate are not overlapped with each other in the pixel region.

18. The photoelectric detector of claim 1, wherein the first bias signal line and the second bias signal line extend in a same direction in the pixel region.

19. A photoelectric detector having a pixel region and a peripheral region surrounding the pixel region, the photoelectric detector comprising:
a base substrate;
plurality of pixel units arranged on the base substrate and positioned in the pixel region, at least one of the pixel units comprising a thin film transistor having a first electrode and a second electrode, a photodiode having a first electrode and a second electrode, and a storage capacitor having a first electrode plate and a second electrode plate,
wherein for each pixel unit, the first electrode of the thin film transistor is connected with the first electrode of the photodiode and the first electrode plate of the storage capacitor, the second electrode of the photodiode is connected with a first bias signal line, the second electrode plate of the storage capacitor is connected with a second bias signal line, and the first bias signal line is electrically connected with the second bias signal line at a connection node located in the peripheral region,
wherein the first bias signal line includes a first extension portion and a first connection portion; the first extension portion extends along a second direction, and the first connection portion is positioned in the peripheral region and connected with the first extension portion; the second bias signal line includes a second extension portion and a second connection portion; the second extension portion extends along the second direction, and the second connection portion is positioned in the peripheral region and connected with the second extension portion;
for the first bias signal line and the second bias signal line electrically connected to the same first pixel group, the first connection portion and the second connection portion are electrically connected through a first connection via.

20. A photoelectric detector having a pixel region and a peripheral region surrounding the pixel region, the photoelectric detector comprising:
a base substrate;
plurality of pixel units arranged on the base substrate and positioned in the pixel region, at least one of the pixel units comprising a thin film transistor having a first electrode and a second electrode, a photodiode having a first electrode and a second electrode, and a storage capacitor having a first electrode plate and a second electrode plate,
wherein for each pixel unit, the first electrode of the thin film transistor is connected with the first electrode of the photodiode and the first electrode plate of the storage capacitor, the second electrode of the photodiode is connected with a first bias signal line, the second electrode plate of the storage capacitor is connected with a second bias signal line, and the first bias signal line is electrically connected with the second bias signal line at a connection node located in the peripheral region,
wherein orthographic projections of the first bias signal line and the second bias signal line on the base substrate are not overlapped with each other in the pixel region.

* * * * *